US006790487B2

(12) United States Patent
Johnson

(10) Patent No.: US 6,790,487 B2
(45) Date of Patent: Sep. 14, 2004

(54) ACTIVE CONTROL OF ELECTRON TEMPERATURE IN AN ELECTROSTATICALLY SHIELDED RADIO FREQUENCY PLASMA SOURCE

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/218,029

(22) Filed: Aug. 14, 2002

(65) Prior Publication Data

US 2003/0045012 A1 Mar. 6, 2003

Related U.S. Application Data

(63) Continuation of application No. PCT/US01/04133, filed on Feb. 9, 2001.
(60) Provisional application No. 60/182,549, filed on Feb. 15, 2000.

(51) Int. Cl.$^7$ ............................................. C23C 14/28
(52) U.S. Cl. ..................... 427/595; 427/488; 315/248
(58) Field of Search ......................... 315/248; 427/488, 427/595; 438/14

(56) References Cited

U.S. PATENT DOCUMENTS

| 5,031,125 | A |   | 7/1991  | Shimizu et al.   |
|-----------|---|---|---------|------------------|
| 5,266,364 | A |   | 11/1993 | Tamura et al.    |
| 5,277,752 | A |   | 1/1994  | Aydil et al.     |
| 5,347,460 | A |   | 9/1994  | Gifford et al.   |
| 5,365,147 | A |   | 11/1994 | Shinohara et al. |
| 5,383,019 | A |   | 1/1995  | Farrell et al.   |
| 5,448,173 | A |   | 9/1995  | Shinohara et al. |
| 5,571,366 | A |   | 11/1996 | Ishii et al.     |
| 5,658,423 | A |   | 8/1997  | Angell et al.    |
| 5,760,573 | A |   | 6/1998  | Paranjpe et al.  |
| 5,804,033 | A |   | 9/1998  | Kanai et al.     |
| 5,846,885 | A |   | 12/1998 | Kamata et al.    |
| 5,897,713 | A |   | 4/1999  | Tomioka et al.   |
| 6,313,587 | B1| * | 11/2001 | MacLennan et al. ........ 315/248 |

OTHER PUBLICATIONS

Wort, "The Emission of Microwave Noise by Plasma," Plasma Physics (Journal of Nuclear Energy Part C), (Northern Ireland: Pergamon Press Ltd., 1962) pp. 353–357.

Westfold, "The Refractive Index and Classical Radiative Processes in an Ionized Gas," Phil. Mag., Series 7, vol. 41, No. 317, Jun. 1950, pp. 509–516.

Long, et al., "New Technique for Microwave Radiometry," IEEE Transactions on Microwave Theory and Techniques, Sep. 1963, pp. 389–397.

(List continued on next page.)

Primary Examiner—John F. Niebling
Assistant Examiner—Andre' C. Stevenson
(74) Attorney, Agent, or Firm—Pillsbury Winthrop LLP

(57) ABSTRACT

A method and apparatus for generating a plasma having a selected electron temperature, by: generating electrical power having components at at least two different frequencies; deriving electromagnetic energy at the at least two different frequencies from the generated electrical power and inductively coupling the derived electromagnetic energy into a region containing an ionizable gas to ionize the gas and create a plasma composed of the resulting ions; and selecting a power level for the electrical power component at each frequency in order to cause the plasma to have the selected electron temperature.

9 Claims, 7 Drawing Sheets

OTHER PUBLICATIONS

Mercier, "The radio–frequency emission coefficient of a hot plasma," Proc. Phys. Soc. 1964, vol. 83, pp. 819–822.

Mumford, "A Broad–Band Microwave Noise Source," Bell System Technical Journal, 28, 608 (1949), pp. 608–618.

Smerd et al, "The Characteristics of Radio–Frequency Radiation in an Ionized Gas, with Applications to the Transfer of Radiation in the Solar Atmosphere,", Council of Scientific and Industrial Research of Australia, SER. 7, vol. 40, No. 307, Aug., 1949, pp. 831–848.

Stickforth, Z"Zur Theorie der Bremsstrahlung in Plasmen hoher Temperatur," Zeitschrift fur Physick 164 (1961), pp. 1–20.

Theimer, "Collective Aspects of Bremsstrahlung Emission and Electrical Conductivity in a Plasma," Annals of Physics, 22, 1963, pp. 102–122.

Fields et al., "Microwave Emission from Non–Maxwellian Plasmas," Physical Review, vol. 129, No. 2, Jan. 5, 1963, ppg. 506–515.

Greene, "Bremsstrahlung from a Maxwellian Gas," Journal of Astrophysics, 103, 693 (1959), pp. 693–701.

Harris, "Microwave Radiometry," The Microwave Journal, Apr., 1960, Part I, pp. 41–46, and Part II, pp. 47–54.

Johnson et al., "Gaseous Discharge Super–High–Frequency Noise Sources," Proceedings of the I.R.E., 39, 908 (1951), pp. 908–914.

Knol, "Determination of the Electron Temperature in Gas Discharges by Noise Measurements," Phillips Res. Rep. 6, 1951, pp. 288–302.

Czyzewski, "Branching of Slip Lines of Alpha–Brass," Letters to the Editor, Journal of Applied Physics, vol. 22, No. 6, Jun. 1951, pp. 846–847.

Bekefi et al., "Incoherent Microwave Radiation from Plasmas," The Physical Review, Second Series, vol. 116, No. 5, Dec. 1, 1959, pp. 1051–1056.

Bekefi et al., "Microwave Measurements of the Radiation Temperature of Plasmas," Journal of Applied Physics, vol. 32, No. 1, Jan. 1961, pp. 25–30.

Bekefi et al., "Kirchhoff's Radiation Law for Plasmas with Non–Maxwellian Distributions," The Physics of Fluids; vol. 4, No. 2, Feb. 1961, pp. 173–176.

Brussaard et al., "Approximation Formulas for Nonrelativistic Bremsstrahlung and Average Gaunt Factors for a Maxwellian Electron Gas," Review of Modern Physics, vol. 34, No. 3, Jul., 1962, pp. 507–520.

Chang, "Bremsstrahlung from a Plasma," The Physics of Fluids, vol. 5, No. 12, Dec. 1962, pp. 1558–1563.

Dicke, "Th Measurement of Thermal Radiation at Microwave Frequencies," The Review of Scientific Instruments, vol. 17, No. 7, Jul. 1946, pp. 268–275.

* cited by examiner

ACTIVE CONTROL OF ELECTRON TEMPERATURE IN AN ELECTROSTATICALLY SHIELDED RADIO FREQUENCY PLASMA SOURCE

This application is a Continuation of International Application PCT/US01/04133, filed on Feb. 9, 2001 and claims the benefit of U.S. Provisional Application 60/182,549, filed Feb. 15, 2000.

BACKGROUND OF THE INVENTION

The present invention relates to plasma assisted processes and apparatus, in particular for performing deposition and etching operations on semiconductor substrates. The invention is particularly directed to the performance of such processes in electrostatically shielded radio frequency (ESRF) plasma sources.

An ESRF plasma source is constructed and operated to generate a plasma in a processing, or plasma, chamber which contains an ionizable gas or a mixture of ionizable gases at a desired pressure. The plasma chamber is usually cylindrical and the gas pressure within the plasma chamber is typically of the order of 0.1 to 10 milliTorr (mT).

The ESRF plasma source typically includes, in addition to the plasma chamber, a radio frequency (RF) oscillator-amplifier that operates at a frequency typically in one of the ISM bands (e.g., 13.56 MHz or 27.12 MHz), a tapped helical or solenoidal coil that is driven by the oscillator-amplifier and surrounds the plasma chamber, and a metal electrostatic shield placed between the helical coil and the wall of the plasma chamber. The oscillator-amplifier includes, or is connected to, an impedance matching network and is typically capable of providing RF power well in excess of 1 kW to the helical coil. The RF power is coupled by the coil into the plasma established within the plasma chamber.

A highly simplified diagram of an ESRF plasma source is shown in FIG. 1. The source is constituted essentially by an enclosure 2 within which a low pressure region containing an ionizable gas can be maintained. Enclosure 2 is surrounded by a grounded RF shield 4 made of a conductive material. The upper portion of enclosure 2 is surrounded by a helical or solenoidal coil 6 having one end grounded via shield 4 and its other end open-circuited. An electrostatic shield 9 is located between the helical or solenoidal coil 6 and the wall of enclosure 2. Electrostatic shield 9 acts to reduce to acceptable levels the amount of RF radiation emanating from the source. RF power is delivered by means of an RF input 5 to helical coil 6 via a tap of coil 6 that is positioned along the length of coil 6 to optimize the ability of any impedance matching network to adjust as required to couple the RF power to the plasma effectively for the intended application under both start-up and run conditions. The portion of helical coil 6 between the tap and the ground end thereof is approximately equivalent, at the operating frequency $f_0$, to a quarter wavelength transmission terminated in a short-circuit.

According to conventional practice in the art, electrostatic shield 9 is provided with a number, possibly 15 to 20, of narrow slots (not shown) which extend vertically parallel to the axis of enclosure 2 and are roughly coextensive, in the vertical direction, with the axial length of helical coil 6. To function properly, electrostatic shield 9 must be provided with at least one well-designed ground connection, as shown in FIG. 1. Preferably, a ground connection is provided at each end of shield 9.

The plasma source shown in FIG. 1 is completed by a substrate support, or chuck, 8 which supports a substrate, such as a semiconductor wafer, that is to be subjected to a deposition or etching procedure. It is to be understood that FIG. 1 does not purport to illustrate the details of such a plasma source, which are already known in the art, and is simply intended to provide an understanding of the basic spatial relations among a plasma source, a power coupling coil, and a substrate support.

The load acting on the oscillator-amplifier is composed principally of helical coil 6, electrostatic shield 9 and the plasma, but also includes various other intrinsic components. The impedance of this load is preferably resonant at the operating frequency $f_0$. Due to the high degree of non-linearity of the plasma, frequency components at integral multiples of the fundamental drive frequency exist with very significant amplitudes. The frequency of each harmonic component may be expressed in the form $$f_n = n f_0, \qquad (1)$$

where n is an integer greater than or equal to 1.

In practice, the electromagnetic energy in a typical ESRF plasma source will simultaneously include components at the fundamental frequency and at one or more of the harmonic frequencies given by equation (1). Through slight variations in the position of the RF tap connection of coil 6, or through other circuit modifications, some control of the harmonic amplitudes is possible.

FIGS. 2A and 2B are plots of the measured frequency spectrum for an inductively coupled plasma source operating at $f_0 = 13.56$ MHz. FIG. 2A shows the relative amplitudes of the fundamental and harmonic frequency peaks above the −20 db line of FIG. 2B, while FIG. 2B shows the overall frequency spectrum. FIGS. 2A and 2B are reproductions of actual spectral analyzer printout. It is believed that the second peak to the right of the 40 MHz indicium in FIG. 2B is a result of a spurious output. It is obvious that significant frequency components are present at the fundamental frequency $f_0$ and at a number of the harmonic frequencies. It has been found that this is true for values of n less than or equal to about nine. A similar result will be obtained at $f_0 = 27.12$ MHz.

Plasma chemistry is greatly affected by the so-called electron temperature of the electrons in an ESRF plasma source and it is known that electron temperature depends on the RF power absorbed by the plasma. It is also known that the electromagnetic energy coupled into the plasma in an ESRF plasma source is absorbed in a plasma surface layer having a thickness typically of the order of one centimeter for $10^{12}$ electron-ion pairs /cm$^2$ and a drive frequency of 13.56 Megahertz This layer thickness is comparable to the skin depth of the RF frequency in the conductivity of the plasma. The absorption of electromagnetic energy in this surface layer is analogous to the well-known "skin effect" in metallic conductors. The surface layer thickness is approximately proportional to the inverse of the square root of the fundamental frequency.

More specifically, the electron temperature is in the region of high power density absorbed proportional to the RF power density absorbed by the plasma. That is, the electron temperature is proportional to the RF power density in the surface layer in which the RF power is absorbed.

It is known that electron temperature can be measured with the aid of Langmuir probes immersed in the plasma, by analysis of the optical emissions from the plasma, or by analysis of the microwave emissions from the plasma. Measurement by analysis of microwave emission from the plasma to determine the electron temperature has the advantage of being non-intrusive and of being usable with various reactive gases as desired that may interfere with the quality of the contact between the plasma and the probe.

Another plasma parameter that is important for practical applications is electron, or plasma, density. It is known that the electron density increases almost linearly with the RF power density in the plasma, i.e., the absorbed RF power divided by the total volume of the plasma. In contrast, the electron temperature is proportional to the RF power divided by the volume of the plasma surface layer.

Electron temperature and electron density both influence the results of plasma assisted processes in different ways. For example, the electron density directly affects the concentration of ionic and neutral species available to react at a wafer surface to produce the desired result. In general, a greater electron density produces a greater process throughput due to a greater deposition, etch, or cleaning rate. However, a plasma process may require an electron density less than some process-dependent value, because the excessive generation of energetic species such as energetic ions or ultraviolet photons may cause damage to the wafer or to semiconductor devices already fabricated or being fabricated on the wafer. Typically, therefore, throughput considerations set a lower bound on electron density and the minimum acceptable process yield sets an upper bound. If the plasma density is to be increased with an attendant increase in processing rate then care needs to be taken to provide a similar chemistry of the gas species modified by the plasma on their path to the wafer. Increasing plasma density necessarily increases the modification of species.

A decrease in electron temperature or in the energy of the plasma electrons decreases the plasma effect on the gas species, therefore increasing plasma density and decreasing electron temperature would allow a higher processing rate with the same chemistry. In reality the situation is a good deal more complicated, but independent control of both electron temperature and electron density provides the ability to optimize process rate and chemistry.

BRIEF SUMMARY OF THE INVENTION

The present invention is a method for generating a plasma having a selected electron temperature, in which electromagnetic energy having components at at least two different frequencies is derived and actively controlled. The derived electromagnetic energy is coupled into a region containing a gas to ionize the gas and create a plasma composed of the resulting ions and an almost exactly equal number of electrons; and a power level for the electrical power component at each frequency is selected in order to cause the plasma to have the selected electron temperature.

The present invention is also an apparatus for generating a plasma having a selected electron temperature. The apparatus essentially includes generating means for deriving and actively controlling electromagnetic energy at at least two different frequencies. The derived electromagnetic energy is inductively coupled into a region containing an ionizable gas to ionize the gas and create a plasma composed of the resulting ions and an equal number of electrons. Plasma by definition is a charge neutral entity while ions by themselves are a beam or isolated charge. The apparatus further includes selecting means coupled to coupling means for selecting a power level for the electromagnetic energy at each frequency in order to cause the plasma to have the selected electron temperature.

In preferred embodiments of processes and apparatus according to the invention, the electron density can be controlled by proper selection of the total power delivered to the plasma, while electron temperature is controlled by supplying the RF power at several frequencies and properly adjusting the distribution of delivered power among the several frequencies.

DETAILED DESCRIPTION OF THE INVENTION

Figure 3:
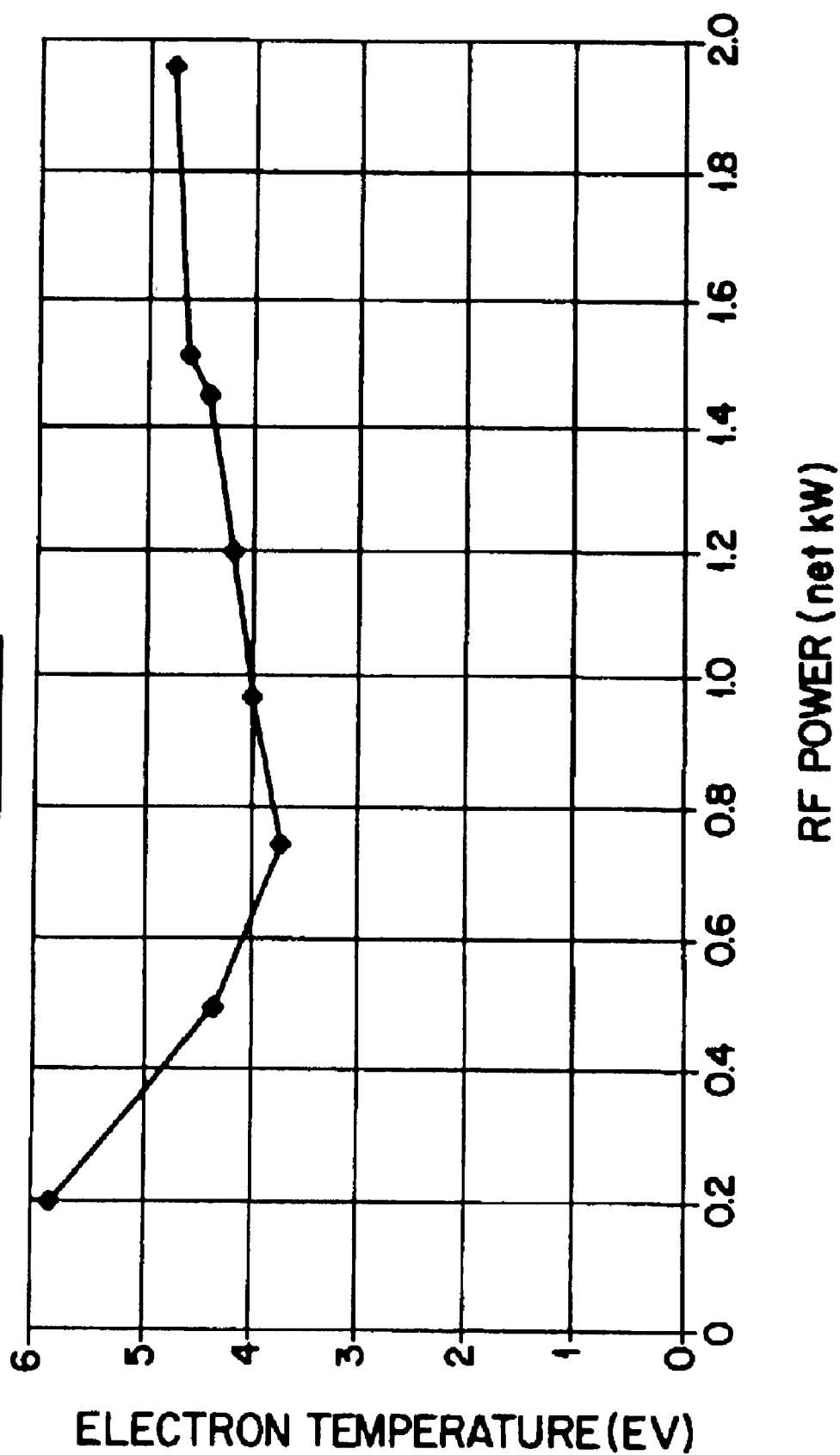
FIG. 3 is a diagram illustrating the dependence of electron temperature on absorbed RF power.

FIG. 3 shows the relation between the, electron temperature of a plasma and the power delivered to the plasma. For an ESRF plasma source operating at a frequency of 27.12 MHz and with a low level of delivered power; e.g, 200W, the electron temperature may typically be of the order of 6 eV. The electron temperature decreases as the delivered power increases, attaining a minimum value less than about 4 eV for about 0.8 kW. As the power increases further, the electron temperature increases, until it attains a value of about 5 eV at 2 kW. The shape of this curve is critically dependent upon plasma source design.

FIG. 3 shows the dependence of electron temperature on power for a particular ESRF plasma source having a diameter of 6 inches (15 centimeters), a gas pressure of 1.41 mT, a maximum power density of 0.54 W/cm$^3$, and an RF power frequency, $f_0$, of 27.12 MHz. The level of absorbed RF power for which the minimum electron temperature occurs increases when the excitation frequency $f_0$ decreases, if all other parameters are kept constant. This result is consistent with the above statement that the electron temperature depends on the RF power density in the surface layer, because the surface layer thickness is greater at lower frequencies. Thus, the curve in FIG. 3 shifts to the right as the frequency decreases.

Consequently, by properly controlling the relative amounts of electromagnetic power delivered to the plasma at two or more frequencies, it is possible to control the electron temperature, at least within certain limits, for a prescribed total amount of electromagnetic power delivered to the plasma. The two different frequencies can have arbitrarily selected frequency values, or can be a fundamental RF frequency and one or more harmonics thereof. The latter frequencies offer the advantage of being easier to generate and control.

The resulting electron temperature in the plasma will have a value which depends on the power levels at the different frequencies and will be between the minimum and maximum electron temperature produced by the RF power components at the different frequencies.

RF power may be generated at a plurality of frequencies by an RF drive system composed of two or more phase-locked oscillator-amplifier-matching network circuits. In addition to an oscillator-amplifier-matching network circuit operating at the fundamental frequency $f_0$, additional oscillator-amplifier-matching network circuits based on principles already known in the art and operating at one or more of the frequencies $nf_0$, where n, or each n, is an integer less than or equal to N, are also connected to the helical coil. N is typically less than about 10. Each matching network must automatically provide a proper load for its own oscillator-amplifier. In addition each oscillator-amplifier-matching network circuit includes a tuned filter to isolate that circuit from all of the other oscillator-amplifier-matching network circuits.

The locations of the connections to the helical coil will, in general, depend on the frequencies of the several oscillator-amplifier-matching network circuits. For example, for two oscillators with the frequencies $f_0$ and $nf_0$, where n is an odd integer, the oscillator-amplifier-matching networks might deliver power to the plasma coil via either the same coil tap or separate coil taps. On the other hand, if n is an even integer, separate taps are required. The tap positions are selected according to the consideration described earlier herein, i.e., so that the portion of the helical coil between the tap and ground terminal is approximately equivalent, at the operating frequency $f_0$, to a quarter wavelength transmission line terminated in a short-circuit.

Figure 1:
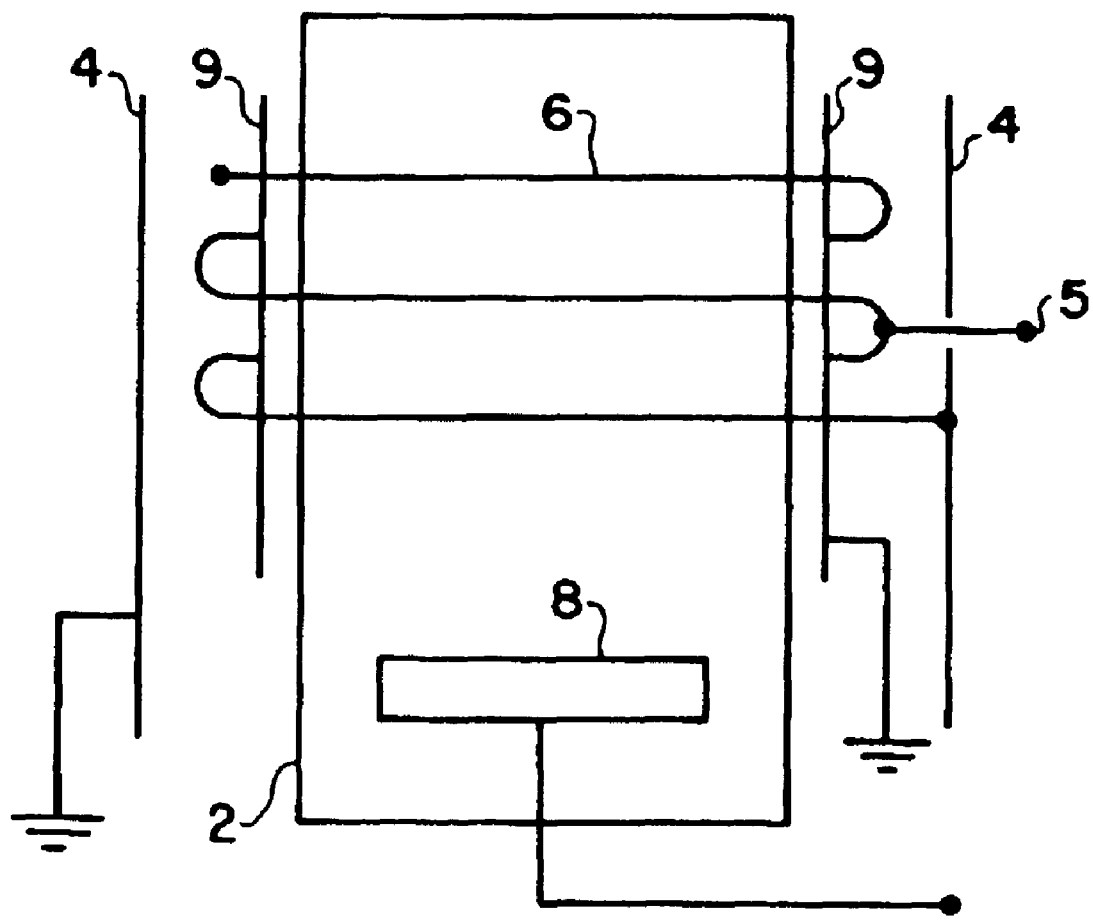
FIG. 1 is a simplified schematic illustration of a conventional ESFR plasma source.
Figure 2A:
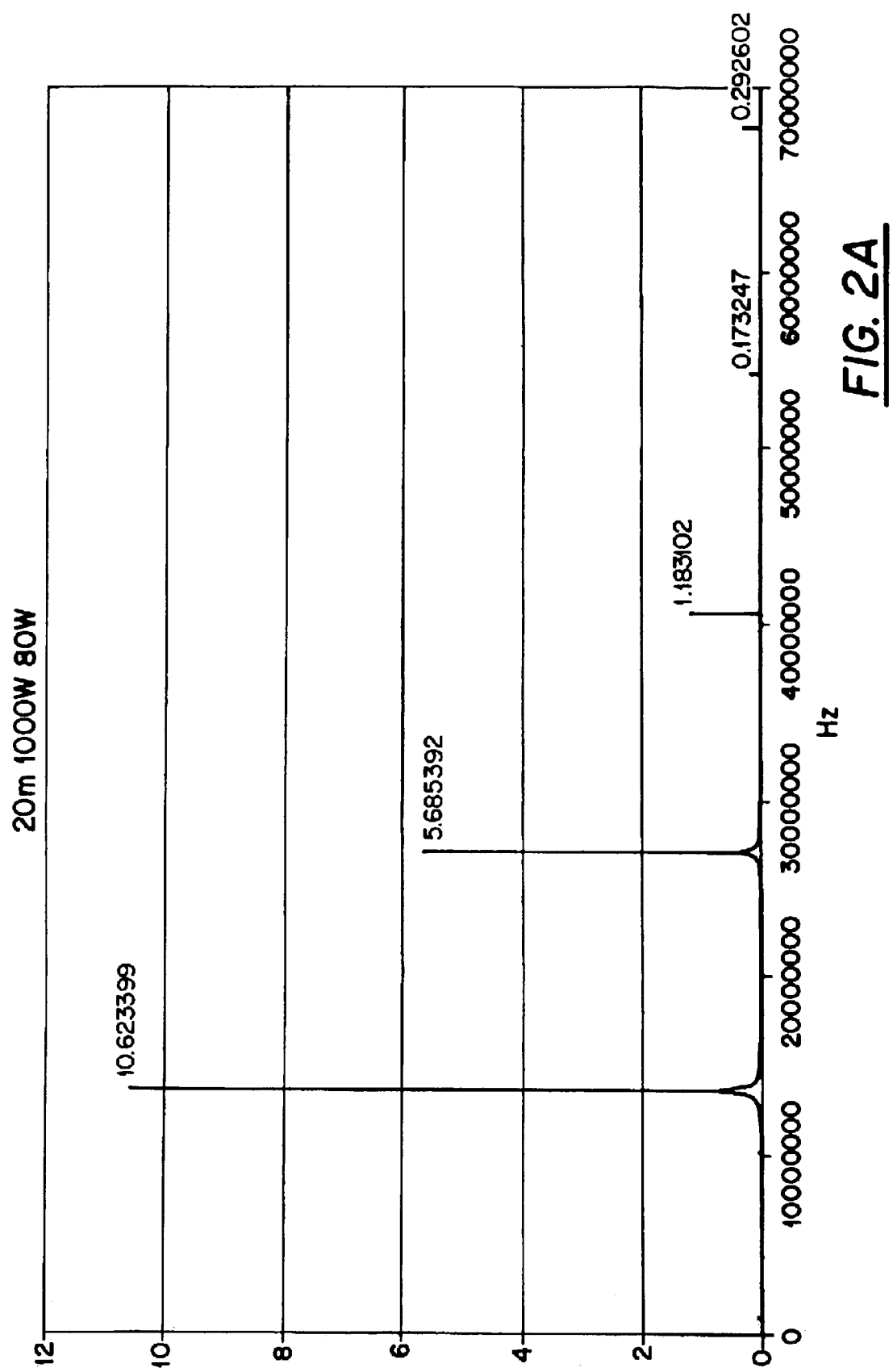
FIGS. 2A and 2B are diagrams of the frequency spectrum of RF energy residing in the plasma source when the RF generator operates at a single frequency.
Figure 2B:
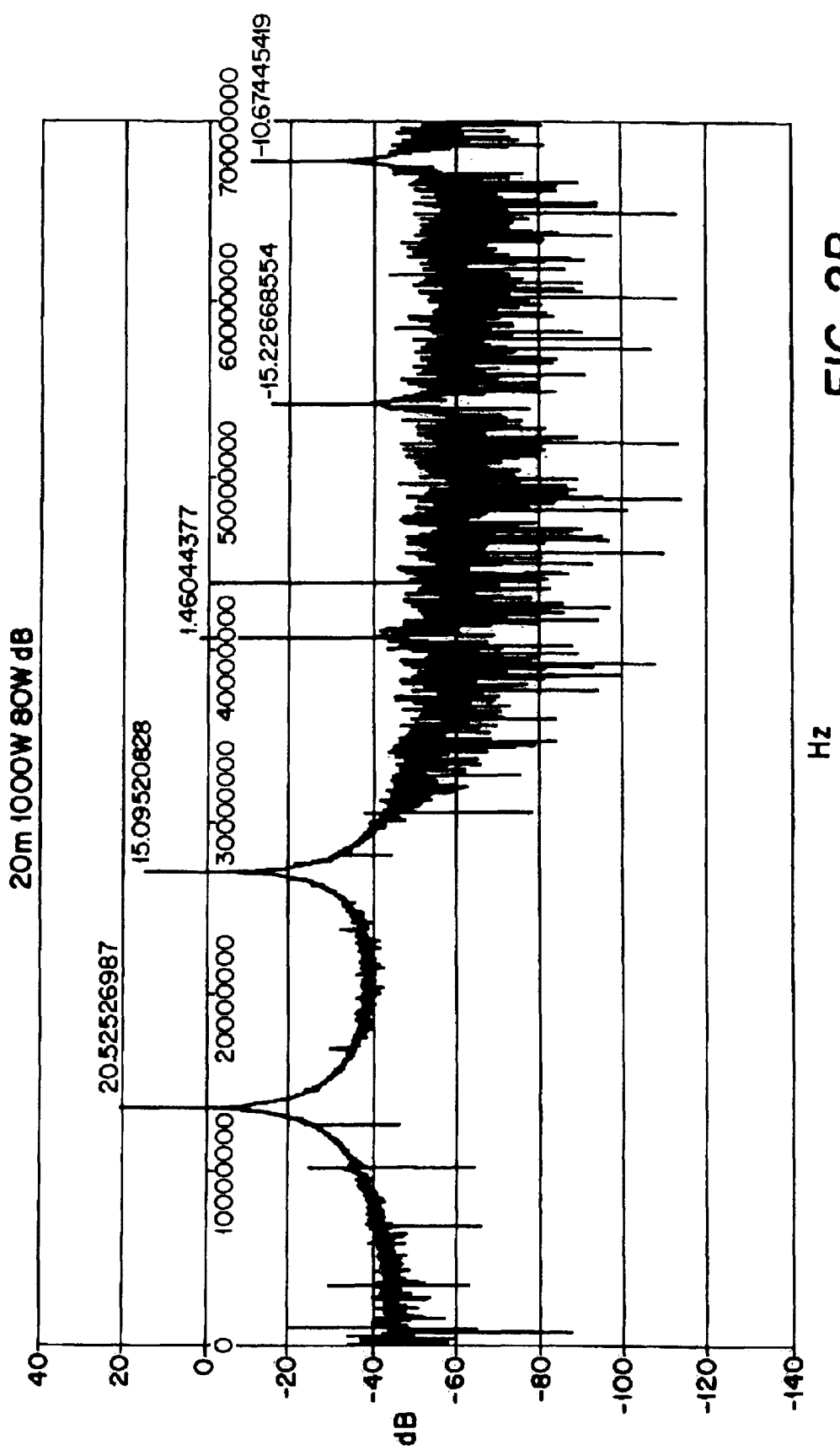
Figure 4:
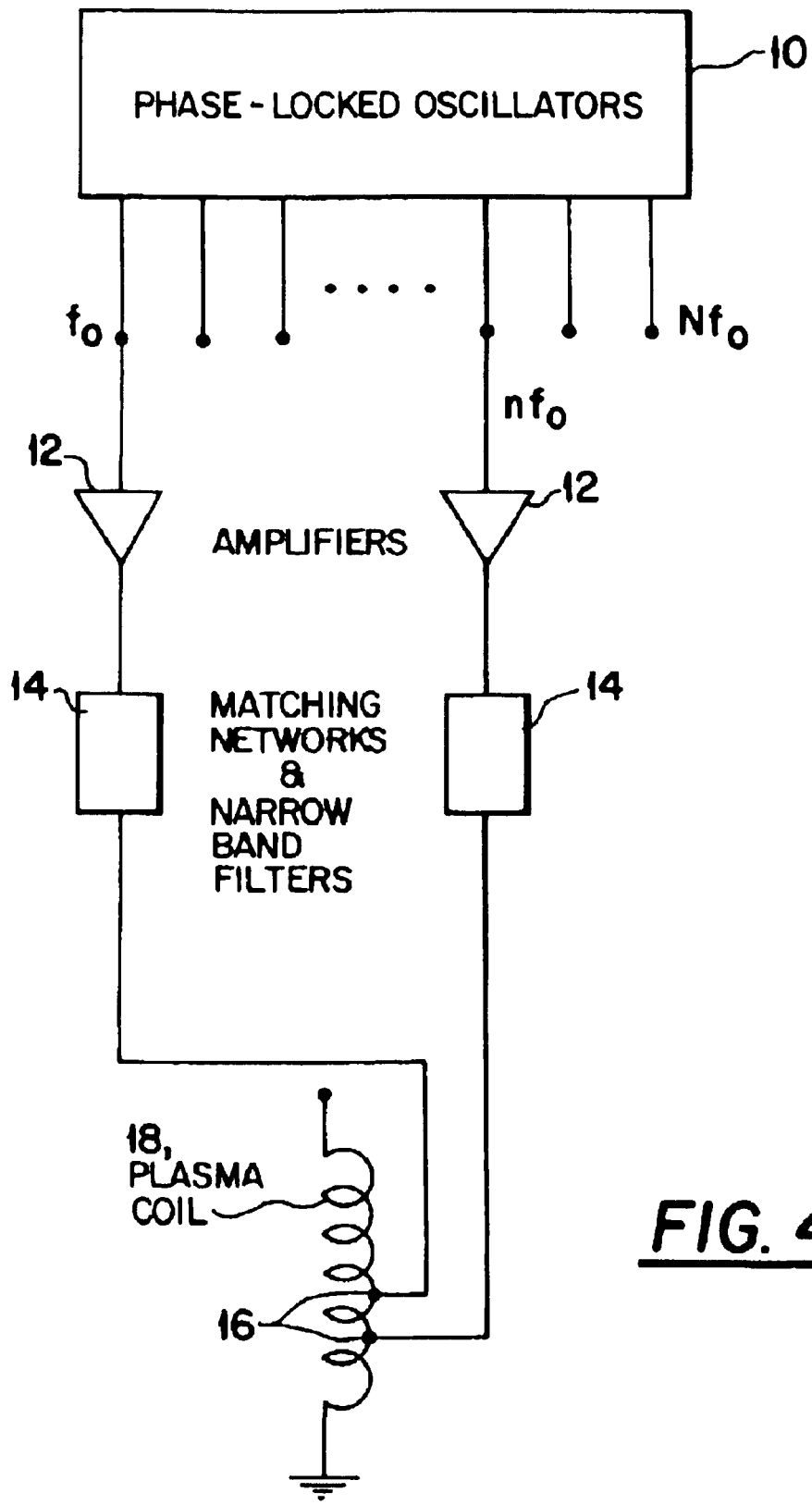
FIG. 4 is a schematic diagram showing a first embodiment of a RF power generator employed in the practice of the present invention.

A simplified block diagram of one system embodying the concept described above is shown in FIG. 4. A group of known phase-locked oscillators 10 has a plurality of outputs each providing RF power at a respective frequency $nf_0$, where n takes on respective integer values between 1 and N. The specific embodiment shown in FIG. 4 is connected to supply power at only two frequencies; however power may be supplied at a larger number of frequencies. Furthermore, it is to be understood that circuits other than the one shown in FIG. 4 are possible. Power at each frequency is supplied via a respective series arrangement of an amplifier 12 and a matching network and narrow band filter 14 to a respective tap 16 of a helical coil 18 which couples RF power into the plasma chamber. Coil 18 is associated with a plasma source in the same manner as coil 6 of FIG. 1.

RF power delivered at each frequency can be varied by, for example, varying the gain of each amplifier 12. The total delivered power level and the distribution of the power between two or more RF frequencies for a given plasma-assisted operation can be determined by testing procedures in which the operation is performed with different combinations of power level values and distribution ratios. Then, the power level value and distribution ratio which produces optimum results will be selected.

According to other possible embodiments, a free-running-oscillator (FRO) plasma generator may be made to operate at two or more frequencies. Such FROs are described in, for example, in a pending Provisional U.S. application 60/143, 548, filed on Jul. 13, 1999, entitled RADIO FREQUENCY POWER SOURCE FOR GENERATING AN INDUCTIVELY COUPLED PLASMA, the entire disclosure of which is incorporated herein by reference.

Figure 5:
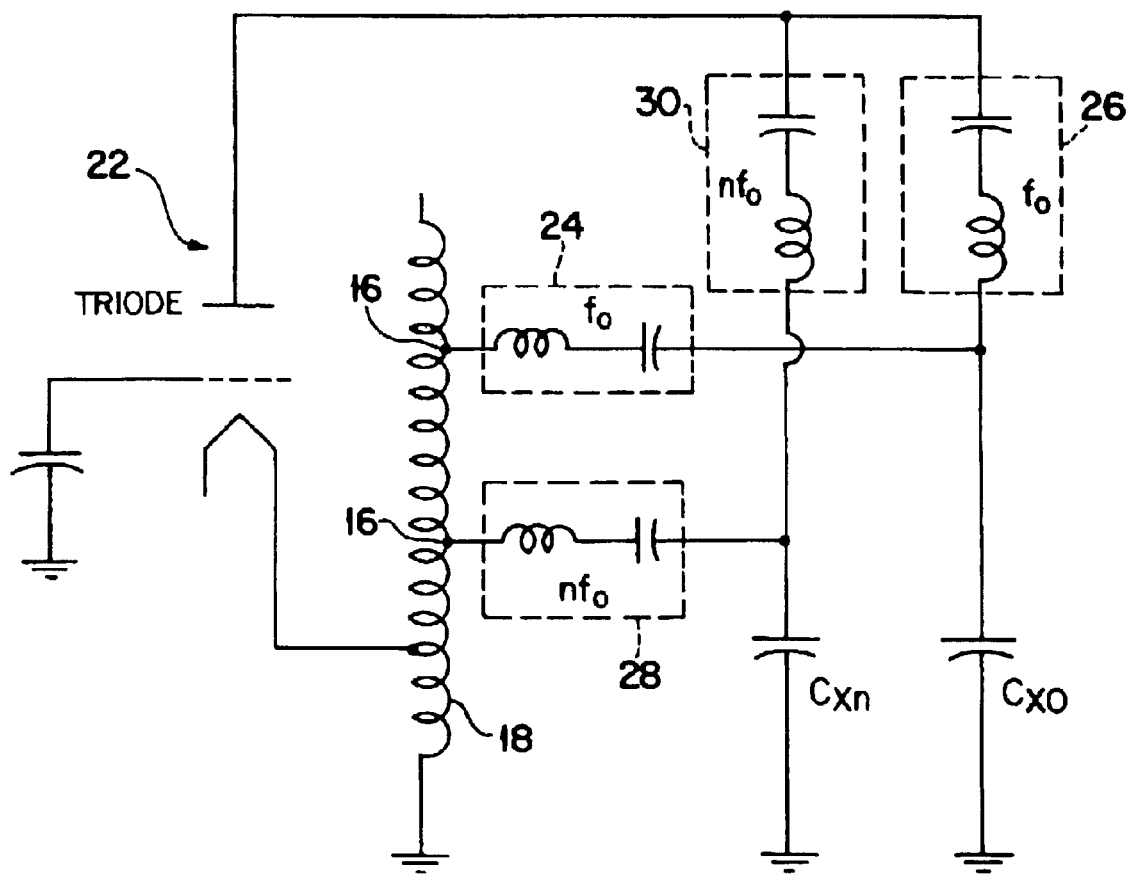
FIG. 5 is a schematic diagram showing a second embodiment of a RF power generator employed in the practice of the present invention.

FIG. 5 is a simplified diagram of a FRO modified to operate simultaneously at the two frequencies $f_0$ and $nf_0$ but otherwise constructed in the manner disclosed in the above-cited provisional application. Conventional DC circuitry which is necessary for the operation of the FRO but not necessary for understanding the concept presented here has been omitted from FIG. 5. FIG. 5 shows a triode 22, although a different kind of tube, such as a tetrode could just as well be used, which is the active component of the FRO, a circuit that operates at frequency $f_o$ and a circuit that operates at the frequency $nf_o$. Frequency determining components for the circuit that operates at frequency $f_0$ are a capacitor $C_{xo}$ and the portion of helical coil 18 connected in parallel with capacitor $C_{xo}$. In addition, a filter 24 is connected between the capacitor $C_{xo}$ and a first tap 16 of coil 18. Filter 24 may, as shown, be composed of a capacitor and an inductor connected in series and having such values that the filter has its resonant impedance at the frequency $f_0$. A similar filter 26, which also has the resonant frequency $f_0$ is connected between the capacitor $C_{xo}$ and the plate of triode 22. The purpose of these tuned filters is to isolate the frequency-determining circuit components for that part of the circuit that operates essentially only at the frequency $f_0$ from the frequency-determining circuit components in that part of the circuit that operates essentially only at the frequency $nf_0$. A tuned filter 28, similar to filter 24, is connected between a capacitor $C_{xn}$ and a second tap 16 of coil 18 and another similar filter 30 is connected between capacitor $C_{xn}$ and the plate of triode 22. Each of filters 28 and 30 is resonant at the frequency $nf_0$ and capacitor $C_{xn}$ together with the portion of helical coil 18 between the second tap 16 and ground determines the frequency $nf_0$.

The power delivered at each frequency can be varied, according to one simple possibility, by inserting a variable impedance between filter 24 and the first tap 16 on coil 18 and another variable impedance between filter 28 and the second tap 16 on coil 18. The RF power levels would be dependent on values of these impedances.

It is to be understood that circuit configurations other than the one shown in FIG. 5 are possible.

According to another embodiment of the invention, there may be provided a control system that includes conventional plasma density and electron temperature measuring components and feedback systems for comparing the measured values with desired values in order to adjust the power level value and distribution ratio.

Figure 6:
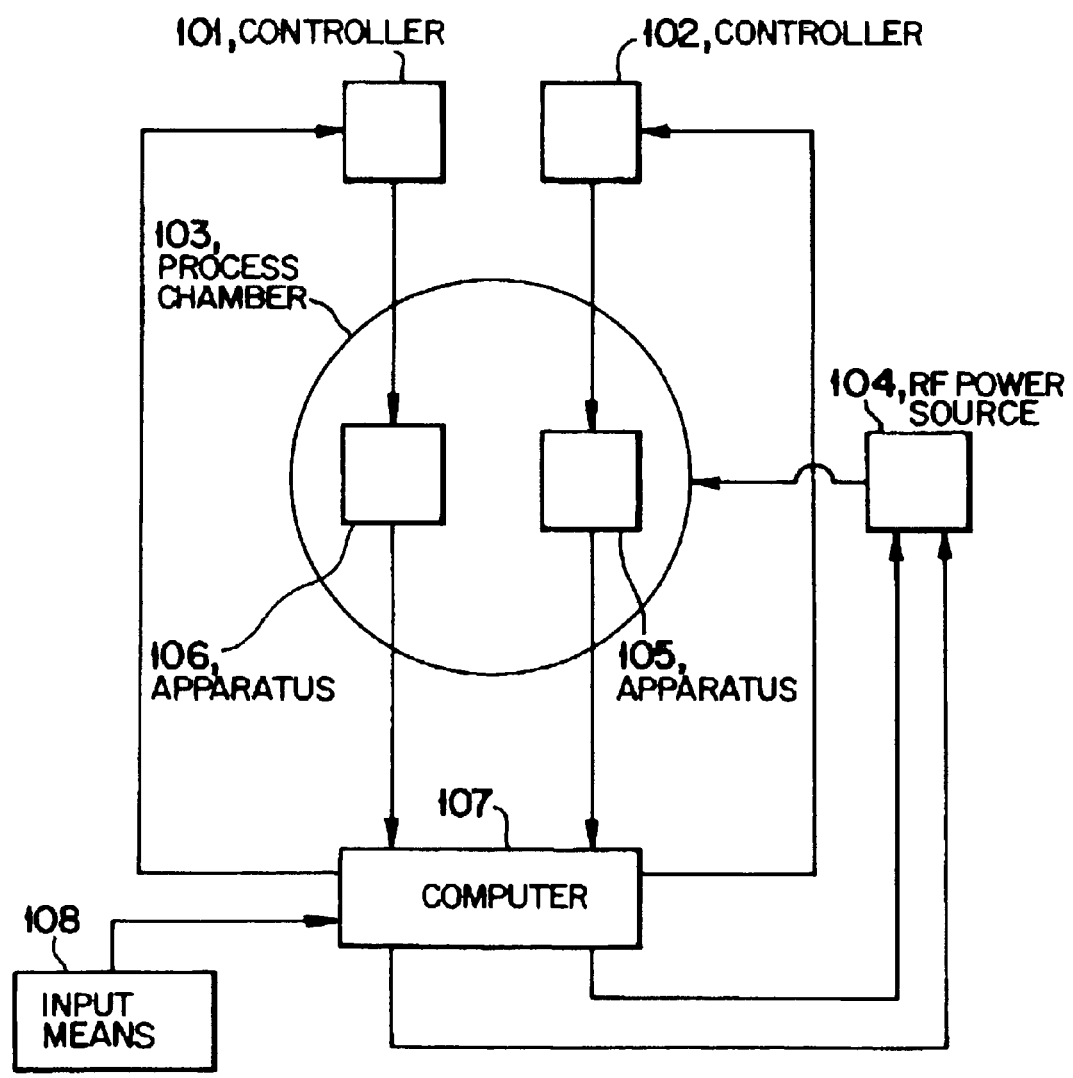
FIG. 6 is a block diagram of an automated system for controlling electron temperature and electron density.

An embodiment of such a system is shown in FIG. 6. The system includes an ESRF plasma source of the type shown in FIG. 1 and which is represented here by a process chamber 103 and an RF power source 104. RF power source 104 may be realized, for example, by an embodiment of the type shown in either FIG. 4 or FIG. 5. In addition to other components appropriate for processing semiconductor wafers, process chamber 103 includes apparatus 105 for measuring electron density and apparatus 106 for measuring electron temperature. Apparatus 105 and 106 may be constituted by known arrangements. For example, apparatus 105 may be a microwave-based system and apparatus 106 may be a microwave system, a Langmuir probe system, or an actinometry system. The system shown in FIG. 6 is controlled by input means 108, which may be a computer keyboard, that communicates with a computer 107. Computer 107 sends instructions to a controller 101 for electron temperature measuring apparatus 106 and receives measured data from electron temperature measuring apparatus 106. Computer 107 also sends instructions to a controller 102 for electron density measuring apparatus 105 and receives measured data from electron density measuring apparatus 105. Computer 107 processes data received from electron density measuring apparatus 105 and from electron temperature measuring apparatus 106 and sends instructions to RF power source 104 to control both the total RF power provided by RF power source 104 and the way in which the total RF power provided to the process chamber is apportioned among the at least two RF frequencies. The two lines between computer 107 and RF source 104 in FIG. 6 are intended to represent the two kinds of information sent by computer 107 to RF source 104. Computer 107 uses data received from electron density measuring apparatus 105 and from electron temperature measuring apparatus 106 and data supplied by the equipment operator through input means 108 to determine from information stored within its memory appropriate changes, if any are required, to the total power provided by RF power source 104 and the apportionment of that RF power among the at least two RF frequencies. Such changes may be required during performance of a process in which plasma conditions must be changed, usually in steps, from one phase of the process to another.

For example, during performance of a particular process, it may be desired to vary the pressure and/or total RF power within the process chamber in order to change the plasma density. Changes in pressure and/or total RF power will, if no other adjustment is made, will result in a change in the electron temperature. Specifically, the electron temperature tends to increase with increasing total RF power and tends to decrease with pressure at lower pressures and increase with pressure at higher pressure, hence exhibiting a minimum at some pressure. According to the present invention, the electron temperature can be stabilized, or held substantially constant, when pressure and/or total RF power are changed, by adjusting the harmonic content of the RF signal coupled to the plasma. Therefore, in order to adjust the electron density without changing the electron temperature, the effects of the change of pressure or power on the electron temperature must be countered by a change in the harmonic content of the coupled RF signal.

The system shown in FIG. 6 can be used to map the relationships among electron density, electron temperature, pressure, power, harmonic amplitudes of the coupled RF power, etc., for different combinations of these parameters to determine the appropriate harmonic content of the RF signal coupled to the plasma for various combinations of pressure and/or total RF power values and the resulting parameter values could be stored in a database. This database would provide a basis for determining the direction to adjust the harmonic content of the coupled RF power to maintain a constant electron temperature while adjusting the electron density through changes of pressure and/or power.

In this art, it is customary in plasma processing operations to change the pressure or RF power during the process. These parameters are typically monitored via a watt-meter at the input to the match network, to monitor forward and reflected power, and a pressure manometer located on the chamber.

In the case of the above-described embodiments, changes in the relative amounts of RF power delivered to the plasma at two or more frequencies have little effect on the plasma density so long as the total power remains constant.

For a plasma volume that is quasi-cylindrical; e.g., with a nominal diameter d and a nominal interaction thickness l, the interaction volume is approximately πdl. The RF power required to obtain a particular electron temperature or a particular plasma density will be roughly proportional to the interaction thickness of the quasi-cylindrical plasma, with all other conditions being equal. Therefore, it follows that once the desired relative amounts of RF power at two or more frequencies have been determined for a particular quasi-cylindrical plasma and a particular application, essentially the same relative amounts will apply for a plasma that has the same diameter but a different length.

In an ESRF plasma source, the control of the induction coil currents associated with the fundamental operating frequency and one or several harmonics of the fundamental operating frequency offers significant advantages over the prior art, primarily because, for a prescribed total RF power, the relative amounts of RF power at the fundamental operating frequency and at one or more harmonic frequencies can be controlled through circuit adjustments, thereby facilitating control of the electron temperature without appreciably changing the electron density, provided that the total power provided to the plasma remains essentially constant.

Since plasma chemistry is greatly affected by electron temperature, control of the electron temperature can have a significant influence on the processing result. For example, for a process in which the gas $CF_4$ is introduced into the reaction chamber, the relative densities of reactive species CF, $CF_2$, $CF_3$, and F as well as, in some cases, ions and/or excited states formed from them depend on the electron temperature and influence the rate at which the desired chemical reaction occurs at the wafer surface. In the usual regime of operation with a prescribed total RF power, the electron temperature will decrease if the RF power associated with the harmonic frequencies is decreased while that associated with the fundamental frequency is increased.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for generating a plasma having a selected electron temperature, comprising:

generating electrical power having components operatina on at least two different frequencies;

deriving electromagnetic energy at the at least two different frequencies from the generated electrical power and inductively coupling the derived electromagnetic energy into a region containing an ionizable gas to ionize the gas and create a plasma composed of the resulting ions; and selecting a power level for the electrical power component at each frequency in order to cause the plasma to have the selected electron temperature.

2. The method according to claim 1, wherein said step of selecting is performed to maintain the total power coupled into the region substantially at a predetermined level.

3. The method according to claim 2, wherein one of the frequencies is a fundamental frequency and the other frequency is a harmonic of the fundamental frequency.

4. The method according to claim 2, wherein said step of inductively coupling comprises inductively coupling energy at more than two frequencies into the region.

5. The method according to claim 4, wherein one of the frequencies is a fundamental frequency and each of the &her frequencies is a respective harmonic of the fundamental frequency.

6. The method according to claim 1, wherein the electrical power components are RF components.

7. The method according to claim 1 wherein said step of selecting comprises varying the power level for the electrical power component at each frequency in steps in order to cause the plasma to have different selected electron temperatures.

8. The method according to claim 1, further comprising measuring at least one of plasma electron density and plasma electron temperature to produce a control value, and controlling said generating step on the basis of the control value.

9. The method according to claim 1, further comprising:
determining power level values for the electrical power component at each frequency in order to cause the plasma to have a selected electron temperature for each of a plurality of different values of total electrical power generated and pressure in the region; and storing data representing the determined power level values and associated values of total electrical power generated and pressure in the region; and wherein said step of selecting is performed by using the stored data to select power level values for existing values of total electrical power generated and pressure in the region.

* * * * *